United States Patent [19]
Lawman

[11] Patent Number: 6,044,025
[45] Date of Patent: Mar. 28, 2000

[54] PROM WITH BUILT-IN JTAG CAPABILITY FOR CONFIGURING FPGAS

[75] Inventor: Gary R. Lawman, San Jose, Calif.

[73] Assignee: Xilinx, Inc., San Jose, Calif.

[21] Appl. No.: 09/244,684

[22] Filed: Feb. 4, 1999

[51] Int. Cl.[7] ..................................................... G11C 7/00
[52] U.S. Cl. ......................... 365/191; 365/201; 395/280; 371/22.3
[58] Field of Search .......................... 371/22.3; 395/280; 365/191, 201

[56] References Cited

U.S. PATENT DOCUMENTS 5,694,399 12/1997 Jacobson et al. ....................... 371/22.3
5,793,987 8/1998 Quackenbush et al. ................. 395/280

FOREIGN PATENT DOCUMENTS

0884599A1 12/1998 European Pat. Off. .

OTHER PUBLICATIONS

"The Programmable Logic Data Book" copyright 1994, pp. 2–32 through 2–45 and 8–45 through 8–52, Xilinx, Inc., 2100 Logic Drive, San Jose, CA 95124.

*Primary Examiner*—David Nelms
*Assistant Examiner*—Thong Le
*Attorney, Agent, or Firm*—Lois D. Cartier

[57] ABSTRACT

The invention provides a structure and method for configuring an FPGA from a PROM using a boundary scan chain. A PROM is provided that comprises JTAG circuitry. Configuration data is stored in the PROM memory as in known PROMs. When the data is retrieved from the PROM memory it is provided on a standard JTAG Test Access Port (TAP). The JTAG-compatible PROM is included as part of a JTAG scan chain, preferably directly preceding the FPGA to be configured by the PROM. The PROM can be controlled either externally or via JTAG commands received down the scan chain. Therefore, a reconfiguration of the FPGA can be initiated via standard JTAG commands. In one embodiment, the PROM itself is programmed with the FPGA configuration data using the JTAG TAP port.

11 Claims, 2 Drawing Sheets

PROM WITH BUILT-IN JTAG CAPABILITY FOR CONFIGURING FPGAS

FIELD OF THE INVENTION

The invention relates to Field Programmable Gate Arrays (FPGAs). More particularly, the invention relates to a PROM for configuring an FPGA.

BACKGROUND OF THE INVENTION

Field programmable logic devices (FPGAs) are a well-known type of digital integrated circuit that may be programmed by a user to perform specified logic functions. An FPGA typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (bitstream) into internal configuration memory cells that define how the CLBs, IOBs, and interconnect are configured. The collective states of the individual memory cells then determine the function of the FPGA.

The configuration data may be read from memory (e.g., an external programmable read-only memory, or PROM) or written into the FPGA by an external device. Some FPGAs also support configuration via boundary scan or JTAG (Joint Test Action Group). IEEE Standard 1149.1 defines a four pin serial interface that drives a 16-state controller (state machine) formed in each compliant IC device. The four pins control transitions of the state machine and facilitate loading of instructions and data into the compliant IC device to accomplish pre-defined tasks. Originally, IEEE Standard 1149.1 was developed to perform boundary scan test procedures wherein the interconnections and IC device placement on printed circuit boards (PCBs) are tested through the connection pins of the PCBs (i.e., without the need for a mechanical probe). Since its establishment, some implementations of boundary scan have been extended to include additional test procedures such as device functional tests, self-tests, and diagnostics. More recently, boundary scan has been modified to provide In-System Programming, whereby configuration data is transmitted into a target programmable device after the device is mounted onto a PCB.

One FPGA supporting IEEE Standard 1149.1 is the XC4000™ FPGA from Xilinx, Inc. Boundary scan configuration of the XC4000 FPGA is described in detail in pages 8–45 through 8–52 of the Xilinx 1994 Data Book entitled "The Programmable Logic Data Book 1994" (hereinafter referred to as "the Xilinx 1994 Data Book"), published in 1994 and available from Xilinx, Inc., 2100 Logic Drive, San Jose, Calif. 95124, which pages are incorporated herein by reference. (Xilinx, Inc., owner of the copyright, has no objection to copying these and other pages referenced herein but otherwise reserves all copyright rights whatsoever.)

When JTAG configuration is used, the FPGA is typically programmed by tester software as part of a sequence of test programs. In other words, the FPGA is programmed via JTAG, a test sequence is performed, and the FPGA is reprogrammed with another configuration in preparation for the next test sequence. Both configuration and test are performed by the same tester software, and the circuit board connections need not be changed back and forth between configuration mode and test mode during the testing process. Therefore, the ability to configure through JTAG considerably facilitates the testing process.

However, when the device is placed in user operation, the FPGA is typically configured using standard configuration methods, such as by reading a bitstream from a PROM. Various well-known configuration methods for the XC4000 FPGA are described in pages 2–32 through 2–45 of the Xilinx 1994 Data Book, which are incorporated herein by reference.

Since testing is performed through JTAG configuration, and user operation configures the device using other methods such as an external PROM, two separate sets of package pins are required to support the two types of configuration. Further, two separate sets of pads must be included on the FPGA in order to accommodate both test and user configuration. It is desirable to provide a method for configuring an FPGA for both test and user operation using the same set of pins, thereby reducing both packaging costs and FPGA manufacturing costs.

SUMMARY OF THE INVENTION

The invention provides a structure and method for configuring an FPGA from a PROM using a boundary scan chain. A PROM is provided that comprises JTAG circuitry. Configuration data is stored in the PROM memory as in known PROMs. However, when the data is retrieved from the PROM memory it is provided on the PROM output pins using a standard JTAG Test Access Port (TAP) comprising, for example, the four pins Test Mode Select (TMS), Test Clock (TCK), Test Data Input (TDI), and Test Data Output (TDO). The TAP port also includes control circuitry (e.g., a JTAG state machine) to interface between the TMS, TCK, TDI, and TDO pins and the PROM memory.

Note that JTAG input pins are preferably provided as well as the JTAG output pin. The inclusion of JTAG input pins permits the JTAG-compatible PROM to be included as part of a JTAG scan chain, preferably directly preceding the FPGA to be configured by the PROM. The PROM can be controlled either externally or via JTAG commands received down the scan chain. Therefore, reconfiguration of the FPGA can be initiated via standard JTAG commands.

The FPGA need not have any dedicated configuration pads, only those needed for the TAP port. Other FPGA pads normally required to allow configuration from a PROM are therefore available to be used for standard user I/O. The invention therefore uses fewer FPGA pads than previously known structures and methods. The reduced number of FPGA pads, and the resulting reduction in package pin requirements, result in a more cost-efficient packaged FPGA.

BRIEF DESCRIPTION OF THE DRAWINGS

The present invention is illustrated by way of example, and not by way of limitation, in the following figures, in which like reference numerals refer to similar elements.

DETAILED DESCRIPTION OF THE DRAWINGS

A structure and method for configuring an FPGA from a PROM using JTAG according to the invention is described. In the following description, numerous specific details are set forth to provide a more thorough understanding of the present invention. However, it will be apparent to one skilled in the art that the present invention may be practiced without these specific details.

Figure 1:
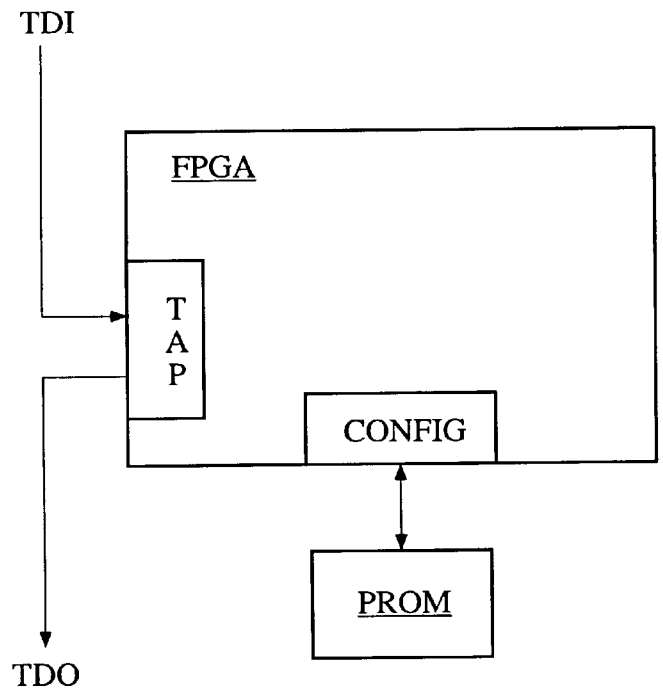
FIG. 1 shows an FPGA configuration structure in a conventional JTAG configuration system.

FIG. 1 shows an FPGA and PROM in a conventional structure in which the FPGA can be configured from either the PROM or through JTAG. The FPGA has two ports, a JTAG TAP port and a conventional configuration port (CONFIG). The TAP port is coupled to both a "Test Data In" (TDI) signal line and a "Test Data Out" (TDO) signal line. These signal lines cause the FPGA to form one element of a conventional boundary scan chain. The configuration port is coupled to a PROM, from which user configuration data is loaded after testing through the TAP port is complete.

Figure 2:
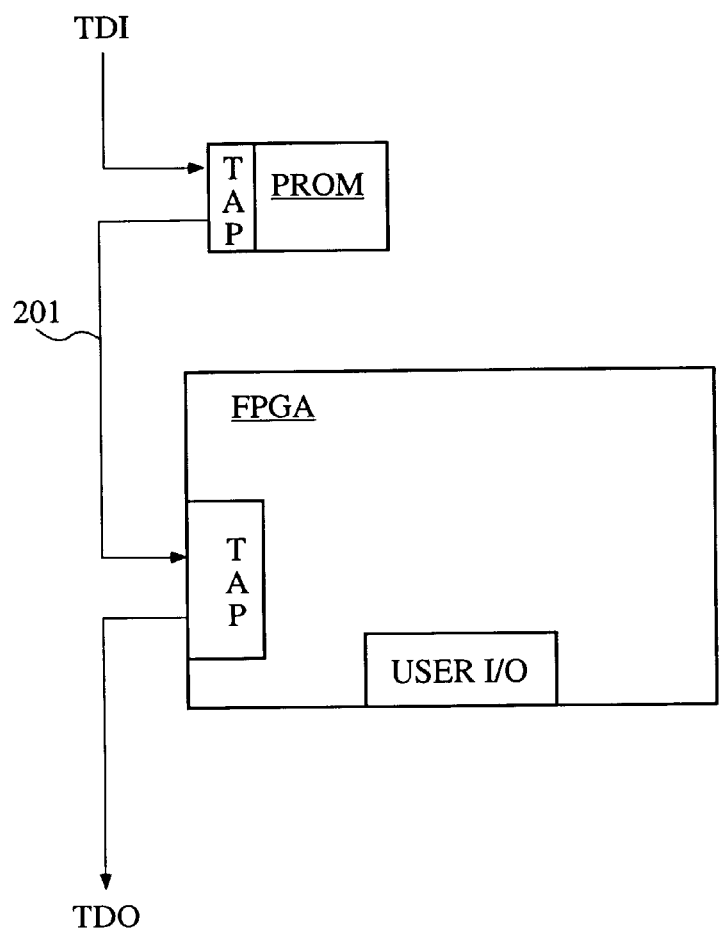
FIG. 2 shows an FPGA configuration structure in a JTAG configuration system according to one embodiment of the invention.

FIG. 2 shows an FPGA in a structure according to one embodiment of the invention, wherein the FPGA is configured through JTAG in both test mode and configuration mode. The FPGA TAP port is unchanged, although the former TDI signal now comes from the PROM via signal line 201. The conventional configuration port is replaced by "USER I/O", reflecting the fact that these FPGA pads are no longer needed for configuration and are therefore available to the user as standard input/output pads.

The PROM holding user configuration data now includes a conventional JTAG TAP port. The TDI pin of the PROM TAP port is driven by the same TDI signal line that directly drives the FPGA in the prior art structure of FIG. 1. The TDO pin in the PROM TAP port drives the TDI pin in the FPGA TAP port. Therefore, the PROM has been inserted into the boundary scan chain ahead of the FPGA.

The PROM has two different modes, a test mode in which the PROM is transparent to the boundary scan chain (used when the tester is configuring or testing the FPGA), and a configuration mode in which the PROM is being used to configure the FPGA. To make this selection, standard JTAG circuitry can be used. The JTAG IEEE Standard 1149.1 provides for both a Test Mode Select (TMS) pin and an instruction register that is used to control the JTAG-related behavior of devices in the boundary scan chain.

Figure 3:
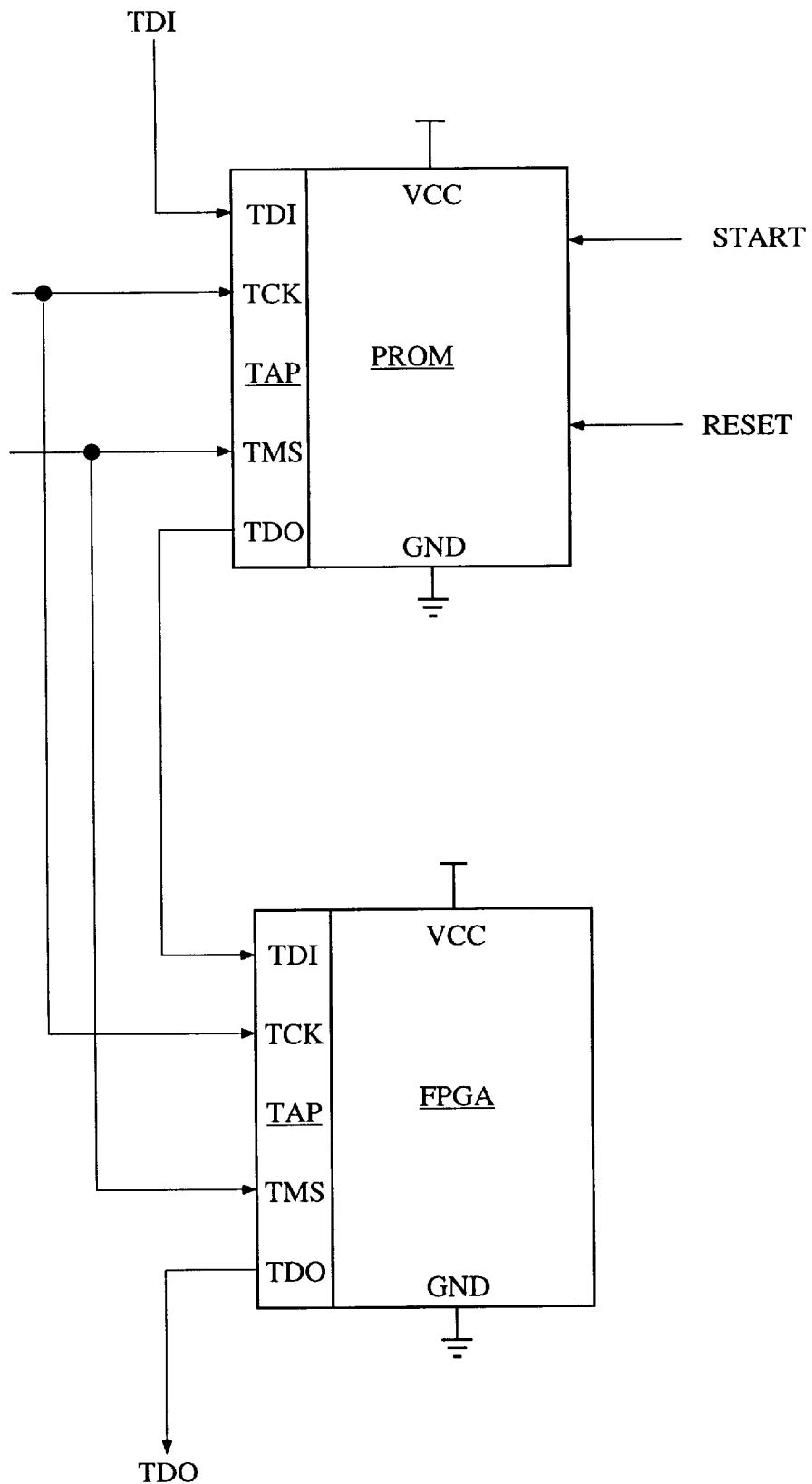
FIG. 3 shows a more detailed FPGA configuration structure for the embodiment of FIG. 2.

FIG. 3 shows a more detailed FPGA configuration structure for the embodiment of FIG. 3. The TDI and TDO pins of each TAP port are used to form the boundary scan chain. The PROM and the FPGA each include both TCK and TMS pins. Power (VCC) and ground (GND) pins are also shown for both devices. The PROM in this embodiment also includes two optional pins, START and RESET. The START pin starts the configuration of the FPGA by the PROM through the JTAG TAP port. (This function can also be performed using a JTAG command, therefore the START pin is optional.) The RESET pin can be either a simple reset pin, or a power-on reset that both resets the PROM and begins configuration of the FPGA. The PROM of FIG. 3 is an efficient implementation that fits conveniently into an 8-pin package.

In one embodiment, the PROM itself is programmed with the FPGA configuration data using the JTAG TAP port. In this embodiment, a "verify" instruction is preferably added to the JTAG extensible instruction set, using well-known techniques. The verify instruction is used to verify the programming of the PROM. When programming the PROM, the JTAG TAP port functions in a manner similar to the FPGA JTAG TAP port. When executing a verify instruction or configuring the FPGA, the TAP port allows the PROM to perform the same functions as a serial PROM, but follows JTAG command protocols.

Clearly, the invention can only be applied to devices that are JTAG-configurable. For example, the Xilinx XC4000 devices are JTAG-configurable. To configure an XC4000 FPGA using JTAG requires providing JTAG commands to configure the instruction register in the FPGA. Therefore, the states and data corresponding to these commands must be generated by the PROM prior to sending the user configuration bitstream to the FPGA. In one embodiment, the command data is included in the bitstream data stored in the PROM. In another embodiment, the command data is hard-wired into the PROM JTAG circuitry.

It has been demonstrated that the structure and method of the present invention offers the advantages of simpler board circuitry, with fewer FPGA pads and fewer FPGA package pins required for configuration. Thus it will be understood that the present invention provides a novel structure and method for programming PROMs and FPGAs through boundary scan.

Those having skill in the relevant arts of the invention will now perceive various modifications and additions that may be made as a result of the disclosure herein. For example, the invention is described herein in terms of IEEE Standard 1149.1. However, the invention can also be applied to other standards and other forms of boundary scan. Accordingly, all such modifications and additions are deemed to be within the scope of the invention, which is to be limited only by the appended claims and their equivalents.

What is claimed is:

1. A programmable read-only memory (PROM) for configuring a field programmable gate array (FPGA) through boundary scan, comprising:

a PROM memory array for storing user configuration data for the FPGA; and a JTAG test port comprising a test data input (TDI) pin, a test data output (TDO) pin, a test clock pin (TCK), a test mode (TMS) pin, and a control circuit;

wherein the JTAG test port is coupled to receive JTAG instructions from the TDI, TCK, and TMS pins, to receive the data from the memory, and to provide the data to the TDO pin, whereby the data is used to configure the FPGA.

2. The PROM of claim 1, wherein the JTAG test port is further coupled to receive the data from the TDI pin and to provide the data to the PROM memory array.

3. The PROM of claim 2, wherein the PROM supports a JTAG verify command for verifying the data in the PROM memory array.

4. A structure for configuring a field programmable gate array (FPGA) from a programmable read-only memory (PROM) through boundary scan, comprising:

a PROM having a PROM memory array for storing user configuration data for the FPGA, and further having a JTAG test port comprising a test data input pin, a test data output pin, a test clock pin, a test mode pin, and a control circuit; and an FPGA having a JTAG test port comprising a test data input pin, a test data output pin, a test clock pin, a test mode pin, and a control circuit, the FPGA test data input pin being coupled to the PROM test data output pin to form a boundary scan chain;

wherein the PROM JTAG test port has a test mode in which the PROM is transparent to the boundary scan chain, and further has a configuration mode in which the PROM is used to configure the FPGA with the user configuration data stored in the PROM memory array through the boundary scan chain.

5. The structure of claim 4, wherein the PROM JTAG test port is coupled to program the PROM memory array with the user configuration data through the boundary scan chain.

6. The structure of claim 5, wherein the PROM supports a JTAG verify command for verifying the user configuration data.

7. The structure of claim 4, wherein the PROM directly precedes the FPGA in the boundary scan chain.

8. A method to configure a field programmable gate array (FPGA) from a programmable read-only memory (PROM) through boundary scan, the PROM comprising a PROM memory array storing configuration data for the FPGA, the method comprising:

forming a boundary scan chain with the PROM and the FPGA in which the PROM precedes the FPGA;

placing the PROM in configuration mode; and loading the configuration data stored in the PROM memory array into the FPGA from the PROM through the boundary scan chain.

9. The method of claim 8, further comprising:

loading the configuration data for the FPGA into the PROM memory array through the boundary scan chain.

10. The method of claim 9, further comprising:

reading back the configuration data through the boundary scan chain to verify the data.

11. The method of claim 8, wherein the PROM directly precedes the FPGA in the boundary scan chain.

* * * * *